US008093650B2

(12) United States Patent
Georgescu et al.

(10) Patent No.: US 8,093,650 B2
(45) Date of Patent: Jan. 10, 2012

(54) SCALABLE ELECTRICALLY ERASEABLE AND PROGRAMMABLE MEMORY (EEPROM) CELL ARRAY

(75) Inventors: Sorin S. Georgescu, San Jose, CA (US); A. Peter Cosmin, San Jose, CA (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 12/366,569

(22) Filed: Feb. 5, 2009

(65) Prior Publication Data
US 2009/0135649 A1      May 28, 2009

Related U.S. Application Data

(63) Continuation of application No. 11/278,103, filed on Mar. 30, 2006, now Pat. No. 7,547,944.

(51) Int. Cl.
*H01L 27/115* (2006.01)
(52) U.S. Cl. ................... 257/326; 257/E27.103
(58) Field of Classification Search .................. None
See application file for complete search history.

(56) References Cited

U.S. PATENT DOCUMENTS

| | | | |
|---|---|---|---|
| 5,364,806 A | 11/1994 | Ma et al. | |
| 5,648,669 A | 7/1997 | Sethi et al. | |
| 5,790,455 A | 8/1998 | Caywood | |
| 5,792,670 A | 8/1998 | Pio et al. | |
| 5,862,082 A * | 1/1999 | Dejenfelt et al. | 365/185.33 |
| 5,914,514 A | 6/1999 | Dejenfelt et al. | |
| 5,940,324 A | 8/1999 | Chi et al. | |
| 6,040,216 A | 3/2000 | Sung | |
| 6,081,451 A | 6/2000 | Kalnitsky et al. | |
| 6,107,659 A | 8/2000 | Onakado et al. | |
| 6,177,315 B1 | 1/2001 | Bergemont et al. | |
| 6,274,898 B1 | 8/2001 | Mehta et al. | |
| 6,284,601 B1 * | 9/2001 | Hoang | 438/258 |
| 6,420,754 B2 * | 7/2002 | Takahashi et al. | 257/326 |
| 6,757,196 B1 * | 6/2004 | Tsao et al. | 365/185.17 |
| 6,835,987 B2 | 12/2004 | Yaegashi | |
| 6,934,192 B2 | 8/2005 | Tailliet et al. | |
| 7,006,381 B2 | 2/2006 | Dormans et al. | |
| 7,106,628 B2 | 9/2006 | Watanabe | |
| 7,148,538 B2 | 12/2006 | Forbes | |

(Continued)

FOREIGN PATENT DOCUMENTS
WO      2008030796 A2      3/2008

*Primary Examiner* — Benjamin Sandvik
(74) *Attorney, Agent, or Firm* — Beyer, Hoffman & Harms, LLP; E. Eric Hoffman

(57) ABSTRACT

A non-volatile memory (NVM) system includes a plurality of NVM cells fabricated in a dual-well structure. Each NVM cell includes an access transistor and an NVM transistor, wherein the access transistor has a drain region that is continuous with a source region of the NVM transistor. The drain regions of each NVM transistor in a column of the array are commonly connected to a corresponding bit line. The control gates of each NVM transistor in a row of the array are commonly connected to a corresponding word line. The source regions of each of the access transistors in the array are commonly coupled. The NVM cells are programmed and erased without having to apply the high programming voltage $V_{PP}$ across the gate dielectric layers of the access transistors. As a result, the NVM cells can be scaled down to sub-0.35 micron geometries.

14 Claims, 6 Drawing Sheets

U.S. PATENT DOCUMENTS

| | | |
|---|---|---|
| 7,157,771 B2 | 1/2007 | Forbes |
| 7,274,075 B2 | 9/2007 | Yaegashi |
| 7,414,893 B2 | 8/2008 | La Rosa |
| 7,450,418 B2 | 11/2008 | Liao et al. |
| 7,528,436 B2 | 5/2009 | Georgescu et al. |
| 7,547,944 B2 | 6/2009 | Georgescu et al. |
| 7,590,005 B2 | 9/2009 | Hsu et al. |
| 2003/0057474 A1 | 3/2003 | Ma et al. |
| 2003/0127683 A1* | 7/2003 | Yoo et al. .................. 257/315 |
| 2003/0127684 A1 | 7/2003 | Yoo et al. |
| 2004/0047217 A1 | 3/2004 | Kamiya |
| 2005/0133851 A1 | 6/2005 | Forbes |
| 2005/0145929 A1* | 7/2005 | Wu et al. .................. 257/326 |
| 2005/0184337 A1 | 8/2005 | Forbes |
| 2005/0265063 A1 | 12/2005 | Forbes |
| 2007/0020852 A1 | 1/2007 | Umezawa et al. |
| 2007/0228451 A1 | 10/2007 | Georgescu et al. |
| 2008/0054336 A1 | 3/2008 | Georgescu et al. |
| 2010/0039859 A1 | 2/2010 | Mokhlesi et al. |

* cited by examiner

SCALABLE ELECTRICALLY ERASEABLE AND PROGRAMMABLE MEMORY (EEPROM) CELL ARRAY

RELATED APPLICATIONS

This application is a continuation of U.S. patent application Ser. No. 11/278,103, entitled "Scalable Electrically Eraseable And Programmable Memory (EEPROM) Cell Array" filed Mar. 30, 2006.

FIELD OF THE INVENTION

The present invention relates to electrically erasable and programmable memory (EEPROM) cells.

RELATED ART

FIG. 1 is a circuit diagram illustrating a conventional memory system 100 that includes a 2×2 array of electrically erasable and programmable memory (EEPROM) cells 101-104. EEPROM cells 101-104 include CMOS access transistors 111-114, respectively, and non-volatile memory (NVM) transistors 121-124, respectively. The drains of access transistors 111 and 113 are coupled to drain (bit line) terminal D1. Similarly, the drains of access transistors 112 and 114 are coupled to drain (bit line) terminal D2. The sources of access transistors 111-114 are coupled to the drains of NVM transistors 121-124, respectively. The sources of NVM transistors 121-124 are commonly coupled to source terminal S12. The select gates of access transistors 111-112 are commonly connected to select line SL1, and the select gates of access transistors 113-114 are commonly connected to select line SL2. The control gates of NVM transistors 121-122 are commonly connected to control line CL1, and the control gates of NVM transistors 123-124 are commonly connected to control line CL2.

FIG. 2 is a cross sectional view of EEPROM cell 101 and peripheral transistors 201 and 202. Peripheral transistors 201-202 are located on the same chip as EEPROM cells 101-104, and are typically used to access these EEPROM cells. Peripheral transistor 201 includes a source 211, a drain 212, a control gate 210, and a gate dielectric layer 213. Gate dielectric layer 213 has a first thickness T1, which is selected in view of a first voltage used to control the peripheral circuitry. For example, thickness T1 can be 75 Angstroms or less, depending on the process. Similarly, peripheral transistor 202 includes a source 221, a drain 222, a control gate 220, and a gate dielectric layer 223. Gate dielectric layer 223 has a second thickness T2, which is selected in view of a second voltage used to control the peripheral circuitry. For example, thickness T2 can be 300 Angstroms to handle a control voltage of 15 Volts.

Access transistor 111 includes a gate dielectric layer 231 having the second thickness T2. A select gate SG1 is located over this gate dielectric layer 231. NVM transistor 121 includes a gate dielectric layer 232, most of which has a thickness close to the second thickness T2. Dielectric layer 232 includes a thin dielectric tunneling region 233, which has a third thickness T3 of about 100 Angstroms. A floating gate FG1, which stores charge, is located over gate dielectric layer 232 (including tunneling dielectric region 233). The tunneling dielectric region 233 is located over a highly doped N+ region 235, which is an extension of the n-type source/drain diffusion shared by access transistor 111 and NVM transistor 121. An inter-poly dielectric layer 234, having a thickness T4, is located over floating gate FG1. A control gate CG1 is located over the inter-poly dielectric layer 234. The thickness T4 of gate dielectric layer 234 is selected in view of the voltages used to control NVM transistor 121. For example, the dielectric layer 234 can be a composite dielectric (oxide-nitride-oxide) with an equivalent silicon dioxide thickness of about 200 Angstroms to handle programming voltages of about 15 Volts. EEPROM cells 102-104 are identical to EEPROM cell 101.

In order to erase EEPROM cells 101 and 102, a high programming voltage VPP (on the order of about 15 Volts) is applied to the control line CL1 and the select line SL1. The drain terminals D1-D2 and the source terminal S12 are grounded. Under these conditions, the floating gates of NVM transistors 121-122 are coupled to a fraction of the programming voltage VPP, which is enough to produce tunneling currents from the underlying diffusion extension region 235 through the thin gate dielectric region 233. Consequently, the tunneling currents in NVM transistors 121-122, will cause excess electrons to be trapped in the floating gates of these NVM transistors. These trapped electrons increase the threshold voltages of NVM transistors 121-122 (i.e., erase NVM transistors 121-122). EEPROM cells 101-102 can be erased independently of EEPROM cells 103-104. Alternately, EEPROM cells 103-104 can be erased at the same time as EEPROM cells 101-102.

In order to program EEPROM cell 101, the high programming voltage VPP (15 Volts), is applied to the drain terminal D1 and to select line SL1. The control line CL1 and the select line SL2 are grounded. The source terminal S12 and drain D2 are left floating. Under these conditions, access transistor 111 is turned on, and the high programming voltage VPP is applied to the drain extension region 235 of NVM transistor 121. The high voltage across the thin gate dielectric region 233 causes electrons to be removed from the floating gate FG1, thereby causing this transistor to have a relatively low threshold voltage.

The drain of access transistor 111 must have a relatively large active region around the contact in order to properly receive the high programming voltage VPP. In addition, the select gate SG1 of access transistor 111 must be relatively large in order to properly receive the high programming voltage VPP. As a result, access transistor 111 cannot be scaled for processes with feature size of less than 0.35 microns. Similarly, the memory transistor 121 has a large gate area, to accommodate the drain extension diffusion region 235 under the tunneling dielectric region 233. The same limitations apply to access transistors 112-114 and memory transistors 122-124, respectively. It would therefore be desirable to have an EEPROM system that can be scaled to sub-0.35 micron processes.

SUMMARY

Accordingly, the present invention provides a memory system that includes a column of EEPROM cells, including a first EEPROM cell having a first access transistor and a first NVM transistor, and a second EEPROM cell having a second access transistor and a second NVM transistor. The first access transistor has a drain region that is continuous with the source region of the first NVM transistor, and the second access transistor has a drain region that is continuous with the source region of the second NVM transistor. The first and second access transistors share a common source region. A first bit line connects the drain of the first NVM transistor and the drain of the second NVM transistor. First and second word lines are connected to the control gates of the first and second NVM transistors, respectively. First and second select lines are connected to the control gates of the first and second access transistors, respectively. Multiple columns can be combined to form an array of EEPROM cells.

The EEPROM cells are fabricated in a first well region, which in turn, is located in a second well region of an opposite conductivity type. For example, if the EEPROM cells are made of n-channel access transistors and n-channel NVM transistors, then the EEPROM cells are fabricated in a p-well region. The p-well region, in turn, is located in an n-well region. Bias voltages are applied to the p-well and n-well regions in accordance with one embodiment of the present invention.

To erase the first NVM transistor, the control gate of the first NVM transistor (i.e., the first word line) is grounded, and a programming voltage $V_{PP}$ (e.g., 15 Volts) is applied to the first and second well regions, the first and second select lines, and the second word line (assuming that the second NVM transistor is not to be erased). The first and second bit lines and the source line are left in a floating state. Under these conditions, a tunneling current flows from the first well region to the floating gate of the first NVM transistor, thereby erasing the first NVM transistor. Any other NVM transistors coupled to the first word line are erased at the same time as the first NVM transistor. The second NVM transistor (and any other NVM transistors coupled to the second word line) can be erased at the same time as the first NVM transistor by grounding the second word line during the erase operation.

To program the first EEPROM cell, the programming voltage $V_{PP}$ is applied to the control gate of the first NVM transistor, and the first and second well regions are grounded. The first bit line, which corresponds to the cell selected to be programmed, is also grounded. The control gates of the first and second access transistors and the control gate of the second NVM transistor are grounded. The sources of the first and second access transistors are left in a floating state. Under these conditions, a tunnel current flows from the floating gate of the first NVM transistor to the first well region, thereby programming this NVM transistor. Bit lines associated with columns that are not to be programmed are held at an intermediate voltage to prevent programming of EEPROM cells in these columns.

Advantageously, the high programming voltage is not applied across the gate dielectric layers of the first and second access transistors during erase and program operations of the present invention. Thus, the gate dielectric layers of the first and second access transistors can be made relatively thin. Similarly, the high programming voltage is not applied to the bit lines or to the source lines, with respect to the underlying well. Consequently, the access transistors and the NVM transistors may be scaled to sub-0.35 micron processes.

The present invention will be more fully understood in view of the following description and drawings.

DETAILED DESCRIPTION

Figure 1:
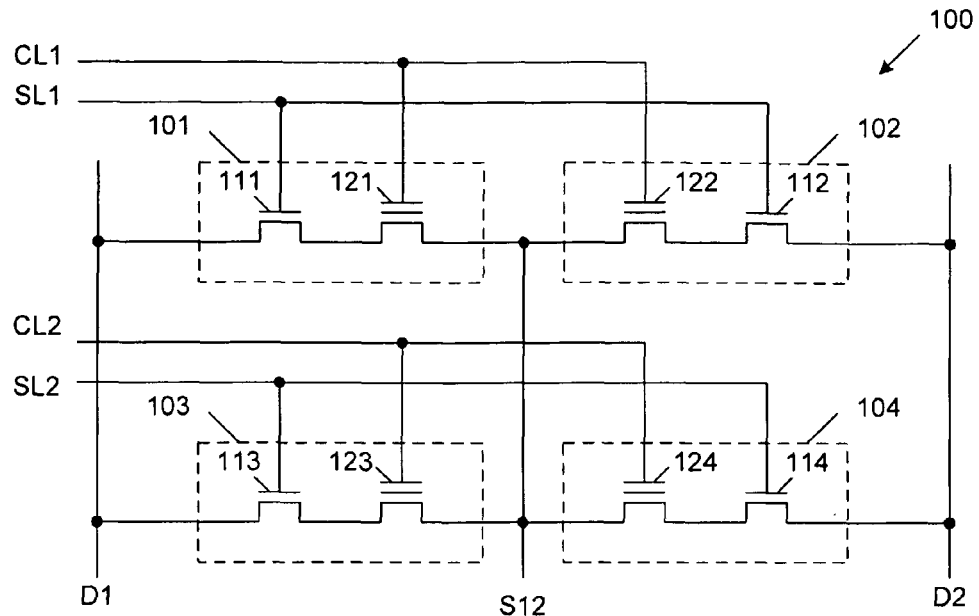
FIG. 1 is a circuit diagram illustrating a conventional memory system that includes an array of electrically erasable and programmable memory (EEPROM) cells.
Figure 2:
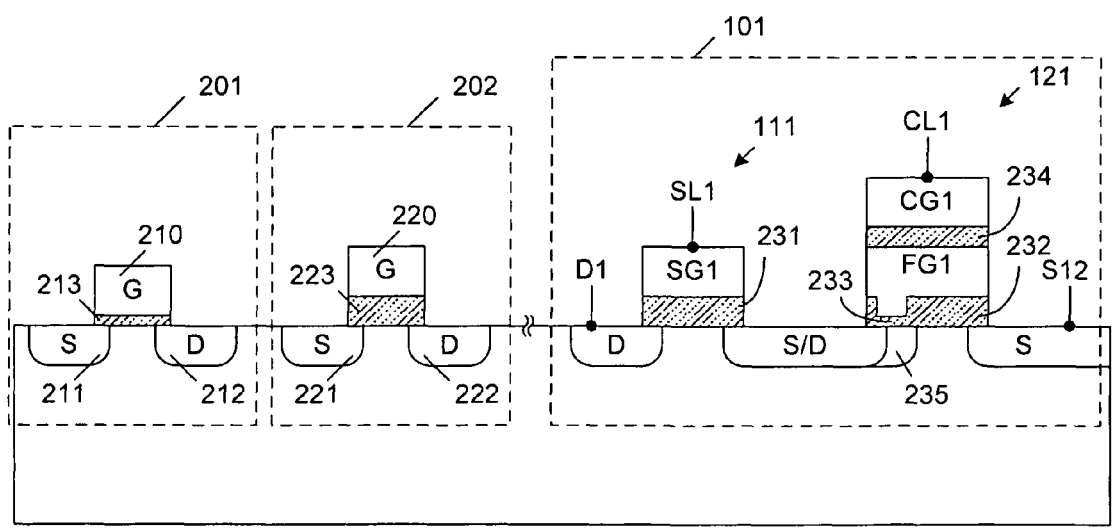
FIG. 2 is a cross sectional view of one of the EEPROM cells of FIG. 1 and a pair of peripheral transistors, which are located on the same chip.
Figure 3:
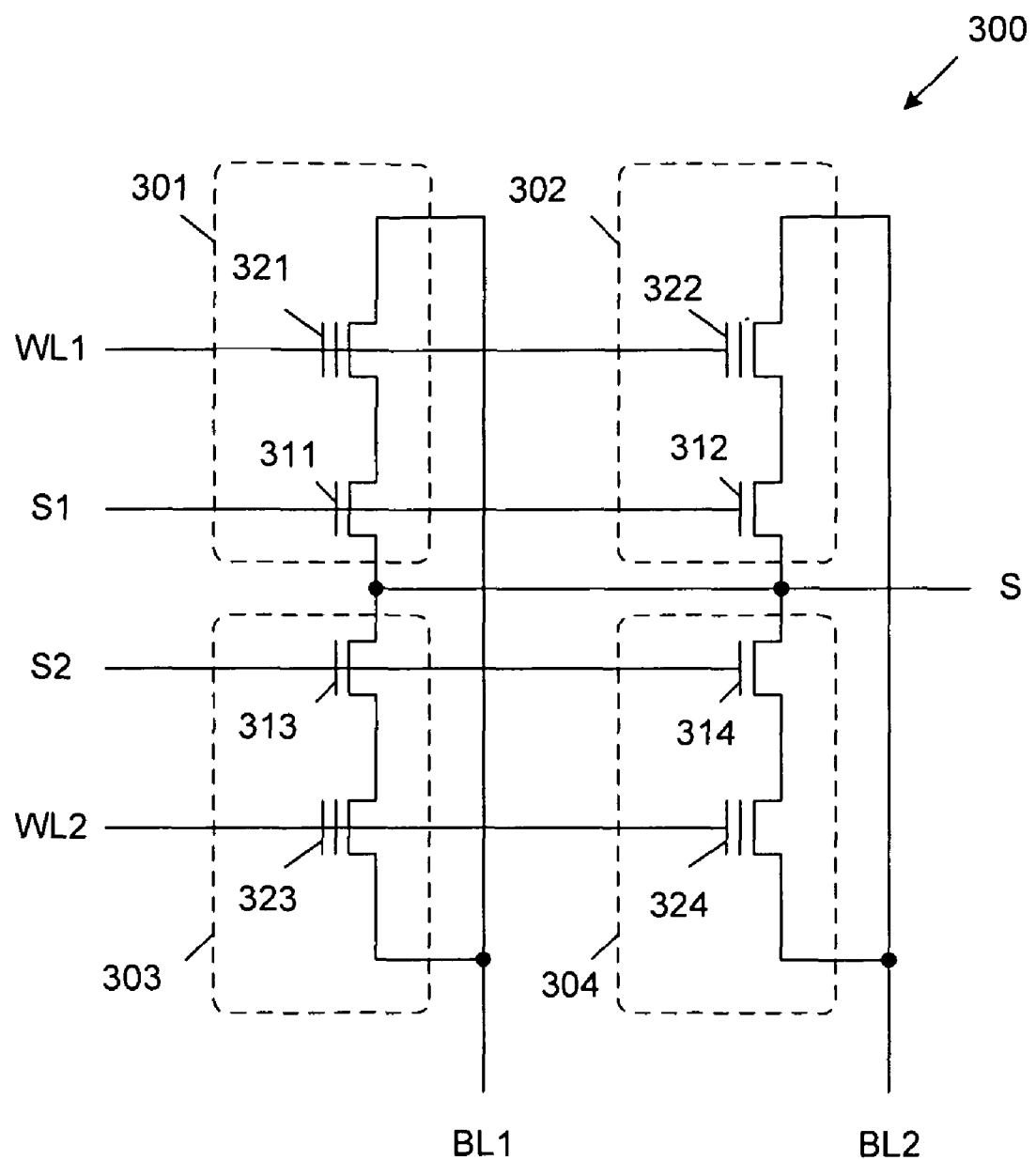
FIG. 3 is a circuit diagram of a memory array, which includes a plurality of EEPROM cells, in accordance with one embodiment of the present invention.

FIG. 3 is a circuit diagram of a 2×2 memory array 300, which includes EEPROM cells 301-304, in accordance with one embodiment of the present invention. Although a 2×2 memory array is described in the following embodiments, it is understood that this memory array can be easily expanded to implement larger arrays. In the described embodiments, EEPROM cells 301 and 302 are located in a first row of memory array 300, and EEPROM cells 303 and 304 are located in a second row of memory array 300. EEPROM cells 301 and 303 are located in a first column of memory array 300, and EEPROM cells 302 and 304 are located in a second column of memory array 300. Data words are written to (and read from) the various rows of memory array 300.

Each of the EEPROM cells 301-304 includes an access transistor 311-314, respectively, and an NVM transistor 321-324, respectively. The source of each access transistor 311-314 is commonly coupled to a source terminal S. The drains of access transistors 311-314 are coupled to the sources of NVM transistors 321-324, respectively. The drains of the NVM transistors in each column are commonly coupled to a corresponding bit line. Thus, the drains of NVM transistors 321 and 323 are coupled to bit line BL1, and the drains of NVM transistors 322 and 324 are coupled to bit line BL2.

The control gates of the NVM transistors in each row are commonly coupled to a corresponding word line. Thus, the control gates of NVM transistors 321 and 322 are coupled to word line WL1, and the control gates of NVM transistors 323 and 324 are coupled to word line WL2.

The select gates of the access transistors in each row are commonly coupled to a corresponding select line. Thus, the select gates of access transistors 301 and 302 are coupled to select line S1, and the select gates of access transistors 313 and 314 are coupled to select line S2.

Figure 4:
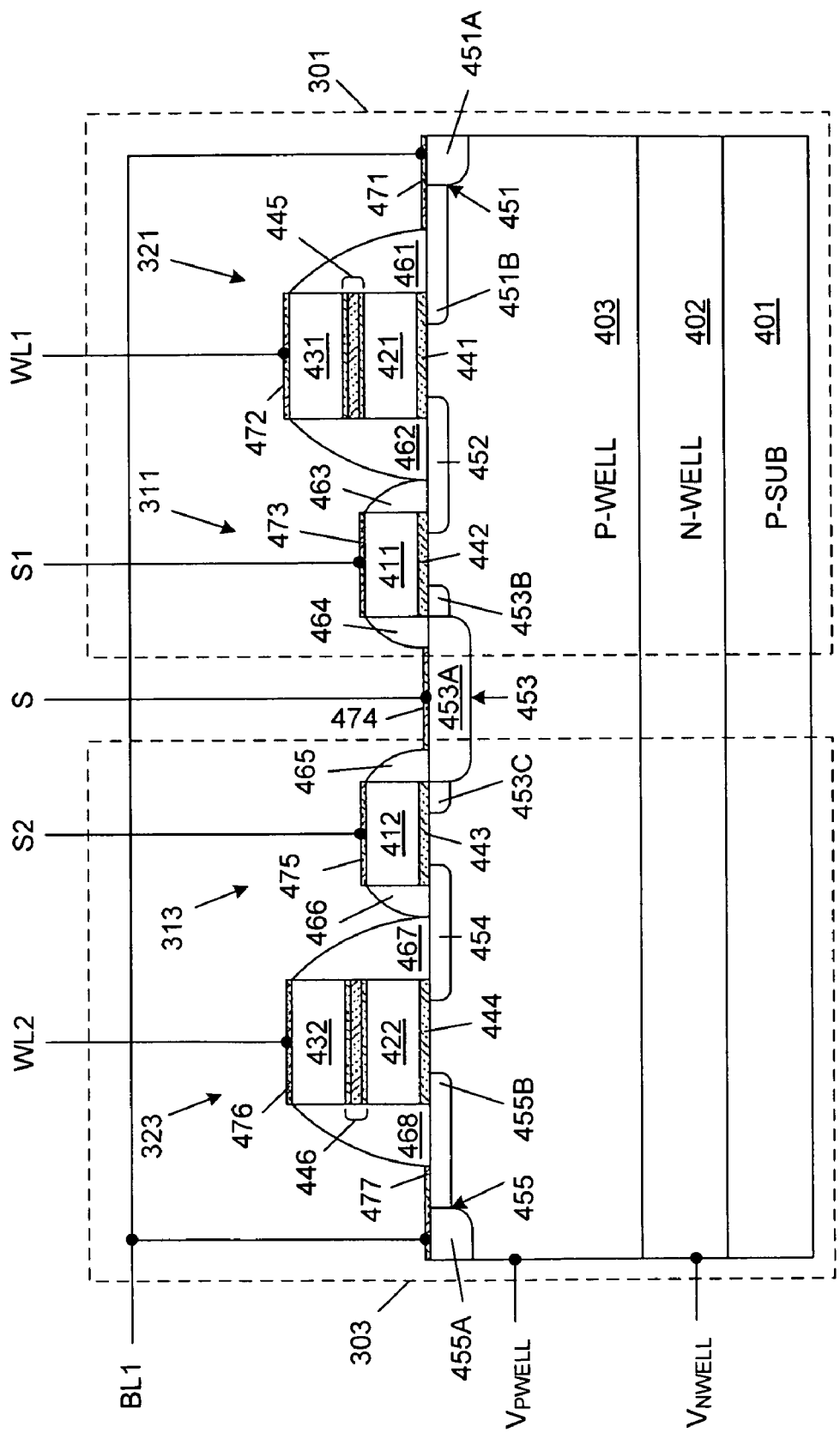
FIG. 4 is a cross sectional view of two of the EEPROM cells of FIG. 3 in accordance with one embodiment of the present invention.

FIG. 4 is a cross sectional view of EEPROM cells 301 and 303 in accordance with one embodiment of the present invention. In the illustrated embodiment, EEPROM cells 301-304 are N-channel devices, which are fabricated in a P-well region 403. The P-well region 403 is contacted to receive a P-well bias voltage, $V_{PWELL}$. The P-well region 403, in turn, is fabricated in an N-well region 402. The N-well region 402 is contacted to receive an N-well bias voltage, $V_{NWELL}$. The N-well region 402, in turn is fabricated in a p-type semiconductor substrate 401.

NVM transistor 321 includes n-type drain region 451, n-type source/drain region 452, gate dielectric 441, floating gate 421, inter-gate dielectric 445, control gate 431 and dielectric sidewall spacers 461-462. Drain region 451 includes n+ contact region 451A and lightly doped (n−) drain region 451B. Drain region 451A is separated from the gate 421, thus preventing high field disturb during programming. Salicide regions 471 and 472 are formed on the upper surfaces of drain contact region 451A and control gate 431. In the described embodiment, inter-gate dielectric 445 is a stacked oxide-nitride-oxide (ONO) structure.

Access transistor 311 includes n-type source/drain region 452 (which is shared with NVM transistor 321), source region 453, gate dielectric 442, control gate 411 and dielectric sidewall spacers 463-464. Source region 453 includes n+ contact region 453A and lightly doped (n−) regions 453B-453C. Salicide regions 473 and 474 are formed on the upper surfaces of control gate 411 and source contact region 453A.

Access transistor 313 includes n-type source region 453 (which is shared with access transistor 311), n-type source/drain region 454, gate dielectric 443, control gate 412 and dielectric sidewall spacers 465-466. Salicide region 475 is formed on the upper surface of control gate 412.

NVM transistor 323 includes n-type drain region 455, n-type source/drain region 454, gate dielectric 444, floating gate 422, inter-gate dielectric 446, control gate 432 and dielectric sidewall spacers 467-468. Drain region 455 includes n+contact region 455A and lightly doped (n−) drain region 455B. Salicide layers 476 and 477 are formed on the upper surfaces of control gate 432 and drain contact region 455A. In the described embodiment, inter-gate dielectric 446 is a stacked oxide-nitride-oxide (ONO) structure.

Although not illustrated in FIG. 4, EEPROM cells 302 and 304 have the same construction as EEPROM cells 301 and 303. Memory array 300 operates as follows in accordance with one embodiment of the present invention.

Figure 5:
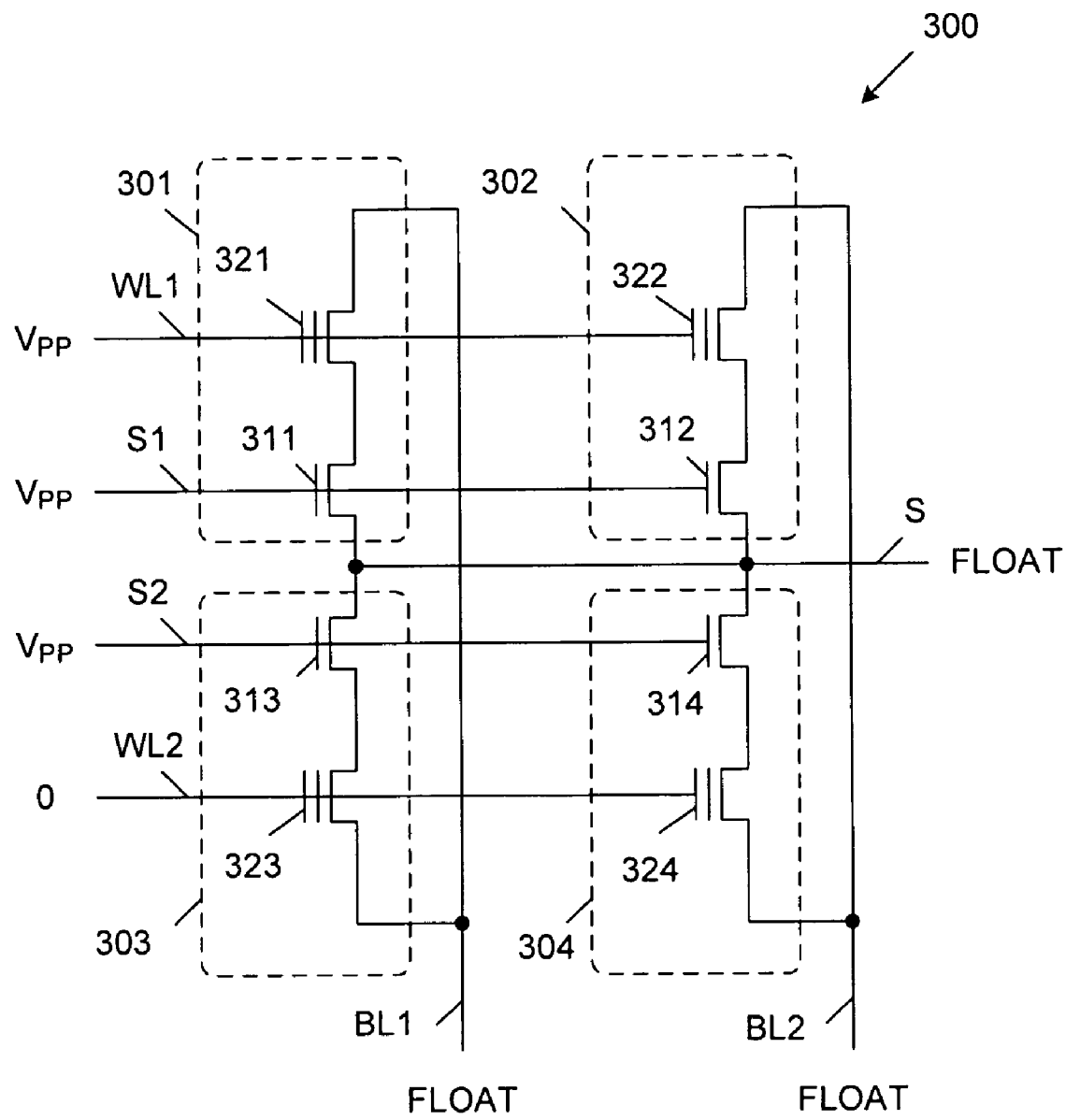
FIG. 5 is a circuit diagram illustrating an erase operation being performed to two of the EEPROM cells of FIG. 3 in accordance with one embodiment of the present invention.

FIG. 5 is a circuit diagram illustrating an erase operation being performed to EEPROM cells 303 and 304 of memory array 300. During this erase operation, common source region S and bit lines BL1-BL2 are maintained in a floating state (i.e., not connected to any external voltage). Word line WL1, select lines S1-S2, P-well region 403 and N-well region 402 are coupled to receive a high programming voltage $V_{PP}$, on the order of about 15 Volts. That is, $V_{PWELL}$ and $V_{NWELL}$ are set equal to $V_{PP}$. Word line WL2, which connects to the NVM transistors 323-324 selected for erase, is coupled to the ground voltage supply terminal.

Under these conditions, a large voltage ($V_{PP}$) exists between the P-well region 403 and the control gate 432 of NVM transistor 323. As a result, a Fowler-Nordheim tunneling current is introduced between P-well region 403 and floating gate 422, which is coupled to the high voltage on the control gate 432 of NVM transistor 323, such that excess electrons are removed from floating gate 422. At the end of the erase operation, NVM transistor 323 exhibits a relatively low threshold voltage. Because NVM transistor 324 is biased in the same manner as NVM transistor 323, NVM transistor 324 is also erased. Note that all NVM transistors in the same row will be simultaneously erased.

In the described example, NVM transistors 321 and 322 are not erased because word line WL1 is held at the high voltage $V_{PP}$. In an alternate example, NVM transistors 321 and 322 can be erased at the same time as NVM transistors 323 and 324 by coupling word line WL1 to the ground voltage supply terminal (rather than the $V_{PP}$ programming voltage terminal).

Note that all drain and source diffusions will acquire a potential close to the voltage of P-well 403, so that the junction bias' associated with these diffusions is close to zero. Also, the high programming voltage $V_{PP}$ is not applied between any terminals of the access transistors 311-314 during the erase operation.

Figure 6:
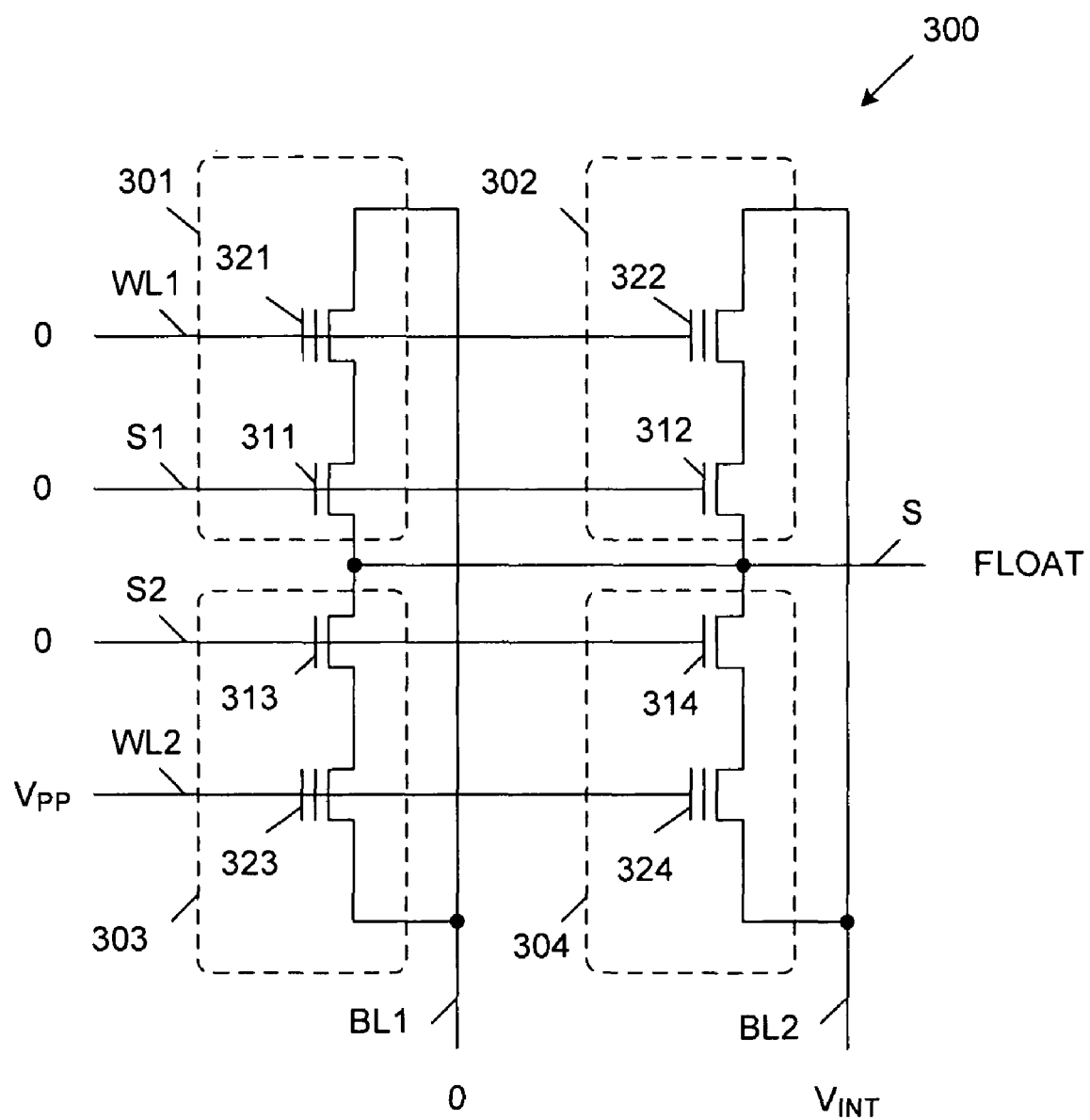
FIG. 6 is a circuit diagram illustrating a programming operation being performed to an EEPROM cell of FIG. 3 in accordance with one embodiment of the present invention.

FIG. 6 is a circuit diagram illustrating a programming operation being performed to EEPROM cell 303 of memory array 300. During this programming operation, common source region S is maintained in a floating state. Word line WL2 is coupled to receive the high programming voltage $V_{PP}$. Select lines S1-S2, word line WL1, bit line BL1, P-well region 403 and N-well region 402 are coupled to the ground voltage supply terminal. Bit line BL2 is coupled to receive an intermediate voltage $V_{INT}$, on the order of about 5 Volts.

Under these conditions, a large voltage (a large fraction of $V_{PP}$) exists between the channel region below gate dielectric 444 (which has the same potential as drain region 455) and the floating gate 422 of NVM transistor 323. As a result, a Fowler-Nordheim tunneling current flows between drain region 455 and floating gate 422 of NVM transistor 323, such that electrons are trapped on floating gate 422. At the end of the programming operation, NVM transistor 323 exhibits a relatively high threshold voltage. Because the drain of NVM transistor 324 is biased with the intermediate voltage $V_{INT}$, the voltage across the gate dielectric located between the drain and the floating gate of NVM transistor 324 is not high enough to induce a Fowler-Nordheim tunneling current. Consequently, NVM transistor 324 is not programmed. However, note that NVM transistor 324 could be programmed at the same time as NVM transistor 323 by connecting bit line BL2 to the ground voltage supply terminal.

In the described example, NVM transistors 321 and 322 are not disturbed because bit line potential is too low for Fowler-Nordheim tunneling. Moreover, there is no drain current through NVM transistors 321 and 322 because the word line WL1 and the select line S1 are held at the ground supply voltage. In an alternate example, NVM transistor 321 can be programmed at the same time as NVM transistor 323 by coupling word line WL1 to receive the high voltage $V_{PP}$.

Note that the high programming voltage $V_{PP}$ is not applied to the access transistors 311-314 during the programming operation.

Figure 7:
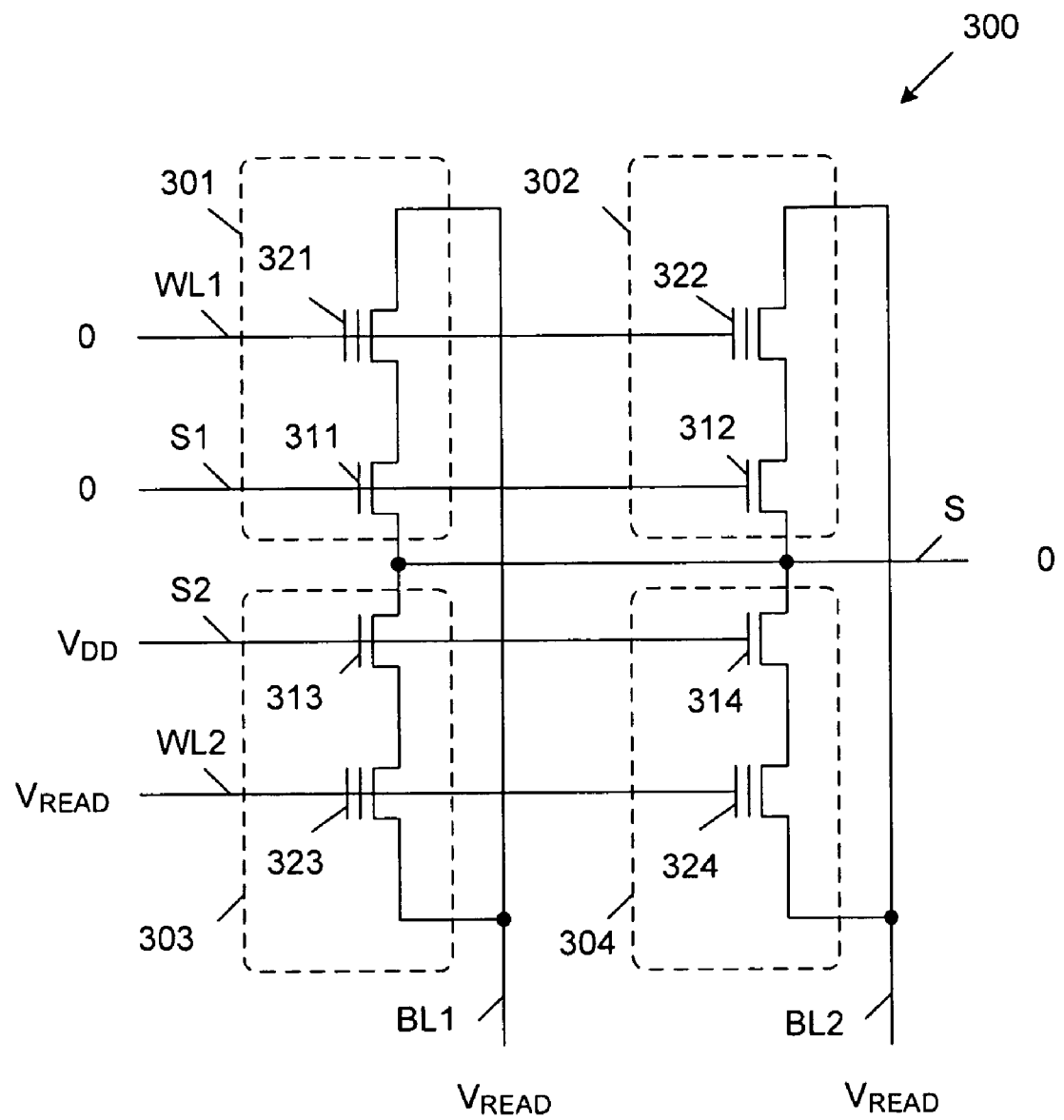
FIG. 7 is a circuit diagram illustrating a read operation of two of the EEPROM cells of FIG. 3 in accordance with one embodiment of the present invention.

FIG. 7 is a circuit diagram illustrating a read operation that accesses EEPROM cells 303 and 304 of memory array 300. During this read operation, common source region S, word line WL1 and select line S1 are coupled to the ground voltage supply terminal. As a result, access transistors 311-312 and NVM transistors 321-322 are turned off. Select line S2 is coupled to receive the $V_{DD}$ supply voltage. As a result, access transistors 313 and 314 are turned on. Word line WL2 is coupled to receive the read voltage $V_{READ}$. The read voltage $V_{READ}$ is selected to have a value that is large enough to turn on a corresponding NVM transistor that is in the erased state (i.e., in a low threshold voltage state). The read voltage $V_{READ}$ is selected to be smaller than the minimum value which turns on a corresponding NVM transistor that is in the programmed state (i.e., in a high threshold voltage state). In the described example, the read voltage $V_{READ}$ is 2 Volts, but other values can be used in the range of 1 to 5 Volts.

Bit lines BL1 and BL2 are coupled to receive the read voltage $V_{READ}$, or a value close to $V_{READ}$ in the same range of 1 to 5V. Sense amplifier circuits (not shown) are also coupled to bit lines BL1 and BL2. These sense amplifiers latch a read data value having a first state if the current flowing on the corresponding bit line exceeds a threshold current value (i.e., if the corresponding NVM transistor is in an erased state). Conversely, these sense amplifiers latch a read data value having a second state if the current flowing on the corresponding bit line is less than the threshold current value (i.e., if the corresponding NVM transistor is in a programmed state).

Note that the high programming voltage $V_{PP}$ is not applied to any transistors during the read operation. Because the high programming voltage $V_{PP}$ is not applied to the drains, sources or select gates of access transistors 311-314 during the erase, program or read operations, these access transistors do not require thick gate oxide and do not require large spacing at diffusion contacts. As a result, memory array 300 can advantageously be scaled to sub-0.35 micron processes.

The present invention also includes a process for fabricating the memory array 300 and the associated peripheral devices. In accordance with one embodiment, this process is implemented as follows. A pad oxide layer is formed over a p-type monocrystalline silicon wafer having a <100> crystalline structure. An N-well region mask is formed over the wafer. N-well implants are then performed through the N-well mask, and the N-well mask is removed. The N-well implant is diffused at a depth of 3-5 microns in a high temperature furnace. After removing the N-well oxide, a pad oxide layer and an overlying silicon nitride ($Si_3N_4$) layer are then formed over the wafer surface. An active region mask, which defines the locations of the active regions to be formed on the wafer, is then formed over the resulting structure. An etch is performed through the active region mask, thereby exposing the inactive regions of the wafer. The active region mask is then removed. Field oxide is then thermally grown in the inactive regions, to a thickness of about 500 nm. The pad oxide layer and silicon nitride layer are then removed, and a sacrificial oxide layer, having a thickness of about 30 nm, is formed over the upper surface of the wafer.

A p-well mask, which defines the locations of P-well regions (e.g., P-well region 403) to be formed in the wafer, is then formed over the resulting structure. P-well implants are then performed through the P-well mask, and the P-well mask is removed. The sacrificial oxide layer is then removed (e.g., by etching).

A high voltage gate dielectric layer is then formed, in two steps, over the resulting structure. The high voltage gate dielectric layer can be, for example, thermally grown silicon oxide having a thickness of about 30 nm. In the described embodiments, the high voltage gate dielectric layer is used to form peripheral transistors that route the $V_{PP}$ programming voltage (15 Volts) to word lines WL1 and WL2. In the first step, a thinner oxide is grown, for example, to a thickness of about 25 nm. An intermediate voltage oxide mask is formed over the structure and the first step oxide is etched. The low voltage oxide mask is then removed. An intermediate voltage gate dielectric layer is then grown over the resulting structure, such that the intermediate voltage areas have an oxide of about 10 nm, while the remaining high voltage area has an oxide of about 30 nm. In the described embodiments, the intermediate voltage gate dielectric layer is used in transistors that operate in response to the intermediate voltage of 5 Volts. For example, the intermediate voltage gate dielectric layer is used to form gate dielectric layers 442 and 443 of access transistors 311 and 313, respectively, and gate dielectric layers 441 and 444 of NVM transistors 321 and 323, respectively. The intermediate voltage gate dielectric layer is also used to form similar structures in access transistors 312 and 314 and NVM transistors 322 and 324. The intermediate voltage gate dielectric layer is also used to form peripheral devices (e.g., transistors) which operate in response to an intermediate voltage.

A first layer of polycrystalline silicon (polysilicon) having a thickness of 100-200 nm is then deposited over the gate dielectric layer. The first polysilicon layer is doped with a n-type impurity (N+), such that the first polysilicon layer becomes conductive. A silicon oxide-silicon nitride-silicon oxide (ONO) structure is then formed over the first polysilicon layer. This ONO structure is used in NVM transistors 321-324 (see, e.g., ONO structures 445-446).

A first gate mask, which defines the locations of the floating gates of NVM transistors 321-324 and of high-voltage peripheral transistors is then formed over the second dielectric layer. A dry etch is performed through the ONO dielectric and the first polysilicon layer and, thereby forming the control gates. The first gate mask is then removed.

A low voltage oxide mask is then formed over the resulting structure. A threshold adjustment is performed for the low voltage transistors and the intermediate oxide is etched. The low voltage oxide mask is then removed. A low voltage gate dielectric layer is then formed over the resulting structure. The low voltage gate dielectric layer can be, for example, thermally grown silicon oxide having a thickness of about 7 nm. In the described embodiments, the low voltage gate dielectric layer is used to form peripheral transistors that control the addressing of memory array 300 and all logic functions.

A second layer of polysilicon having a thickness of 200-300 nm is then deposited over the ONO layer. The second polysilicon layer is doped with an n-type impurity (N+), such that the second polysilicon layer becomes conductive.

A second gate mask, which defines the locations of the low-voltage peripheral transistors, is then formed over the second layer of polysilicon. A dry etch is performed through the second polysilicon layer, thereby forming the gates of the low-voltage peripheral transistors. The second gate mask is then removed.

A high voltage n-type lightly doped drain (HVNLDD) mask, which defines the locations of the lightly doped n-type regions in memory array 300 (e.g., 451B 452, 453B, 453C, 454 and 455B) and the lightly doped n-type regions in the high voltage n-channel peripheral transistors. An n-type LDD implant is performed through the HVNLDD mask, thereby forming the lightly doped drain regions of the high-voltage NMOS transistors. The HVNLDD mask is then removed.

A low voltage n-type lightly doped drain (NLDD) mask, which defines the locations of the lightly doped n-type regions the low voltage n-channel peripheral transistors. An n-type LDD implant is performed through the NLDD mask, thereby forming the lightly doped drain regions of the low-voltage peripheral NMOS transistors. The NLDD mask is then removed.

A p-type lightly doped drain (PLDD) mask, which defines the locations of the lightly doped p-type regions of the p-channel peripheral transistors. A p-type LDD implant is performed through the PLDD mask, thereby forming the lightly doped drain regions of the p-channel peripheral transistors. The PLDD mask is then removed.

A sidewall dielectric layer is then deposited over the resulting structure. The sidewall dielectric layer is then etched, thereby forming dielectric sidewall spacers (e.g., sidewall spacers 461-468) adjacent to the various polysilicon structures.

A n-type source/drain mask, which defines the locations of the n-type source and drain contact regions (e.g., regions 451A, 453A and 455A) is formed over the resulting structure. A n+ implant is performed through the n-type source/drain mask, thereby forming the n-type source/drain contact regions of the NMOS transistors. The n-type source/drain mask is then removed.

A p-type source/drain mask, which defines the locations of the p-type source and drain contact regions is formed over the resulting structure. A p+ implant is performed through the p-type source/drain mask, thereby forming the required p-type source/drain contact regions of the PMOS transistors. The p-type source/drain mask is then removed.

A salicide mask, which defines the locations where salicide should not be formed, is formed over the resulting structure. A layer of metal silicide is then deposited over the resulting structure. An anneal step is then performed, thereby causing the metal silicide layer to react with underlying silicon regions, thereby forming self-aligned polysilicide (salicide). The unreacted portions of the metal silicide layer are then removed. The salicide mask is then removed.

The back end processing is then performed, wherein: pad oxide/oxide is deposited over the resulting structure; BPSG deposition/flow is performed over the pad oxide/oxide; contact openings are formed through the pad oxide/oxide/BPSG; the contact openings are filled with conductive plugs; a first metal layer is deposited over the resulting structure and patterned; an inter-metal oxide layer is formed over the resulting structure; the inter-metal oxide is planarized by chemical mechanical polishing (CMP); vias are formed in the inter-metal oxide; the vias are filled by conductive plugs; a second metal layer is deposited and patterned; a bake is performed in the presence of hydrogen; and a passivation layer is deposited and patterned to expose the pads on the wafer.

Although the invention has been described in connection with several embodiments, it is understood that this invention is not limited to the embodiments disclosed, but is capable of various modifications, which would be apparent to one of ordinary skill in the art. Accordingly, the present invention is only limited by the following claims.

We claim:

1. A memory system comprising:
a first non-volatile memory cell having a first access transistor and a first non-volatile memory transistor, wherein the first access transistor has a drain region that is continuous with a source region of the first non-volatile memory transistor;
a second non-volatile memory cell having a second access transistor and a second non-volatile memory transistor, wherein the second access transistor has a drain region that is continuous with a source region of the second non-volatile memory transistor, wherein the first and second access transistors share a common source region, and wherein the first and second non-volatile memory cells are located in a first well region having a first conductivity type, and wherein the first well region is located in a second well region having a second conductivity type, opposite the first conductivity type;
a first bit line connected to a drain of the first non-volatile memory transistor and a drain of the second non-volatile memory transistor;
means for programming the first non-volatile memory transistor by Fowler-Nordheim tunneling; and
means for erasing the first non-volatile memory transistor by Fowler-Nordheim tunneling.

2. The memory system of claim 1, further comprising:
a first word line coupled to a control gate of the first non-volatile memory transistor; and
a second word line coupled to a control gate of the second non-volatile memory transistor.

3. The memory system of claim 1, further comprising:
a first select line coupled to a control gate of the first access transistor; and
a second select line coupled to a control gate of the second access transistor.

4. The memory system of claim 1, further comprising:
a third non-volatile memory cell having a third access transistor and a third non-volatile memory transistor, wherein the third access transistor has a drain region that is continuous with a source region of the third non-volatile memory transistor;
a fourth non-volatile memory cell having a fourth access transistor and a fourth non-volatile memory transistor, wherein the fourth access transistor has a drain region that is continuous with a source region of the fourth non-volatile memory transistor, and wherein the third and fourth access transistors share a common source region; and
a second bit line connected to a drain of the third non-volatile memory transistor and a drain of the fourth non-volatile memory transistor.

5. The memory system of claim 4, further comprising:
a first word line coupled to a control gate of the first non-volatile memory transistor and a control gate of the third non-volatile memory transistor; and
a second word line coupled to a control gate of the second non-volatile memory transistor and a control gate of the fourth non-volatile memory transistor.

6. The memory system of claim 5, further comprising:
a first select line coupled to a control gate of the first access transistor and a control gate of the third access transistor; and
a second select line coupled to a control gate of the second access transistor and a control gate of the fourth access transistor.

7. The memory system of claim 4, wherein the common source region of the first and second access transistors is coupled to the common source region of the third and fourth access transistors.

8. The memory system of claim 7, wherein the first, second, third and fourth access transistors share a common source region.

9. The memory system of claim 1, wherein the means for programming and the means for erasing comprise means for selectively applying a high programming voltage to the first and second non-volatile memory transistors, the first and second access transistors, the first well region and the second well region during program and erase operations, such that the high programming voltage is not applied across a gate dielectric of either the first access transistor or the second access transistor during the program and erase operations.

10. The memory system of claim 1, wherein the first non-volatile memory transistor includes a first floating gate and a first control gate, wherein the first floating gate is entirely covered by the first control gate.

11. A memory system comprising:
a first non-volatile memory cell having a first access transistor and a first non-volatile memory transistor, wherein the first access transistor has a drain region that is continuous with a source region of the first non-volatile memory transistor;
a second non-volatile memory cell having a second access transistor and a second non-volatile memory transistor, wherein the second access transistor has a drain region that is continuous with a source region of the second non-volatile memory transistor, wherein the first and second access transistors share a common source region, and wherein the first and second non-volatile memory cells are located in a first well region having a first conductivity type, and wherein the first well region is located in a second well region having a second conductivity type, opposite the first conductivity type, wherein the first and second access transistors include control gates, and the first and second non-volatile memory transistors include floating gates, wherein the control gates and the floating gates are separated from the first well region by identical gate dielectric layers; and
a first bit line connected to a drain of the first non-volatile memory transistor and a drain of the second non-volatile memory transistor.

12. The memory system of claim 1, wherein the means for programming the first non-volatile memory transistor comprises means for applying a programming voltage across a control gate of the first non-volatile memory transistor and the drain of the first non-volatile memory transistor, whereby the programming voltage induces Fowler-Nordheim tunneling within the first non-volatile memory transistor.

13. The memory system of claim 12, wherein the means for programming the first non-volatile memory transistor further comprises means for applying zero Volts to the drain of the first non-volatile memory transistor, the first well region and a gate of the first access transistor.

14. The memory system of claim 12, wherein the means for programming the first non-volatile memory transistor further comprises means for placing the common source region in a floating condition.

\* \* \* \* \*